US011467436B2

(12) United States Patent
Wang et al.

(10) Patent No.: US 11,467,436 B2
(45) Date of Patent: Oct. 11, 2022

(54) DRIVE CIRCUIT AND DRIVE METHOD FOR DIMMING GLASS, AND DIMMING GLASS DEVICE

(71) Applicant: BOE TECHNOLOGY GROUP CO., LTD., Beijing (CN)

(72) Inventors: Yongbo Wang, Beijing (CN); Chen Meng, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 200 days.

(21) Appl. No.: 16/766,812

(22) PCT Filed: Dec. 13, 2019

(86) PCT No.: PCT/CN2019/125283
§ 371 (c)(1),
(2) Date: May 26, 2020

(87) PCT Pub. No.: WO2020/155888
PCT Pub. Date: Aug. 6, 2020

(65) Prior Publication Data
US 2021/0208436 A1 Jul. 8, 2021

(30) Foreign Application Priority Data

Feb. 3, 2019 (CN) .......................... 201910108654.9

(51) Int. Cl.
G02F 1/133 (2006.01)
G02F 1/1345 (2006.01)
(Continued)

(52) U.S. Cl.
CPC .......... *G02F 1/13306* (2013.01); *G02F 1/137* (2013.01); *G02F 1/13452* (2013.01);
(Continued)

(58) Field of Classification Search
CPC ...................................... G02F 1/1345
See application file for complete search history.

(56) References Cited

U.S. PATENT DOCUMENTS 10,845,665 B1 * 11/2020 Bayat ........................ E06B 9/24
2012/0162593 A1 6/2012 Tsai et al.
(Continued)

FOREIGN PATENT DOCUMENTS

CN 102855851 1/2013
CN 203301391 11/2013
(Continued)

Primary Examiner — Sang V Nguyen
(74) Attorney, Agent, or Firm — Leason Ellis LLP

(57) ABSTRACT

A drive circuit for a dimming glass, a dimming glass device, and a drive method are disclosed. The drive circuit for the dimming glass includes: a controller, an input terminal of the controller receiving a control instruction, and configured to output a voltage control signal at an output terminal of the controller according to the control instruction; and a voltage adjustment circuit, a control input terminal of the voltage adjustment circuit being connected to the output terminal of the controller, a power input terminal of the voltage adjustment circuit being connected to a first power supply, and a voltage output terminal of the voltage adjustment circuit being connected to a voltage input terminal of the dimming glass, and configured to generate an output voltage signal at the voltage output terminal of the voltage adjustment circuit according to the voltage control signal.

19 Claims, 10 Drawing Sheets

(51) Int. Cl.
  *G02F 1/137* (2006.01)
  *G06F 3/02* (2006.01)
  *G09G 3/36* (2006.01)
  *H03K 17/687* (2006.01)

(52) U.S. Cl.
  CPC ............... G06F 3/02 (2013.01); G09G 3/36 (2013.01); H03K 17/6871 (2013.01); *G09G 2320/0626* (2013.01); *G09G 2320/08* (2013.01); *G09G 2330/021* (2013.01)

(56) References Cited

U.S. PATENT DOCUMENTS

2013/0258220 A1* 10/2013 Uehara ............... G09G 3/3696
  349/33
2017/0138626 A1* 5/2017 Lu ..................... G05B 15/02
2019/0108796 A1* 4/2019 Li ..................... G02F 1/133528

FOREIGN PATENT DOCUMENTS

| CN | 105551446 | * | 5/2016 | ........... G02F 1/1343 |
| CN | 106712502 | * | 5/2017 | ............... H02H 7/12 |
| CN | 106873197 |   | 6/2017 |                         |
| CN | 106970536 |   | 7/2017 |                         |
| CN | 107040140 | * | 8/2017 | ............. H02M 3/28 |
| CN | 107147316 |   | 9/2017 |                         |
| CN | 207586720 |   | 7/2018 |                         |
| CN | 110471232 | * | 11/2019 | ............. G02F 1/163 |

* cited by examiner ated on the high-tech liquid crystal film and the two glass layers. For example, according to different control methods and control principles, the dimming glass can be switched between a transparent state and an opaque state by various methods, such as an electric control method, a temperature control method, a light control method, a voltage control method, or the like. Due to the limitation of various conditions, currently, the mass-produced dimming glasses on the market are almost all electronic control dimming glasses. For example, in the case where the dimming glass is powered off, the liquid crystal molecules in the dimming glass will show an irregular dispersion state, in this case, the electronic control dimming glass shows an appearance state that transmits light but is opaque; and in the case where the dimming glass is powered on, the liquid crystal molecules in the dimming glass are neatly arranged, and the light can penetrate freely, in this case, the dimming glass momentarily shows a transparent state.

A dye is a substance that absorbs light of a specific wavelength and can enable the light reflected from the dye or transmitted through the dye appear colored. In the case where a dye is added to the liquid crystal, due to the structural characteristics of the liquid crystal molecules, the absorption of light by the liquid crystal molecules along a molecular axis and the absorption of light by the liquid crystal molecules along a direction perpendicular to the molecular axis are different. Therefore, the dye molecules dissolved in the liquid crystal can show different colors with different orientations of the liquid crystal molecules under the action of an electric field.

DRIVE CIRCUIT AND DRIVE METHOD FOR DIMMING GLASS, AND DIMMING GLASS DEVICE

CROSS-REFERENCE TO RELATED PATENT APPLICATIONS

This application is a U.S. National Stage Application under 35 U.S.C. § 371 of International Patent Application No. PCT/CN2019/125283, filed Dec. 13, 2019, which claims the benefit of priority of Chinese Patent Application number 201910108654.9 filed Feb. 3, 2019, both of which are incorporated by reference in their entireties.

TECHNICAL FIELD

The embodiments of the present disclosure relate to a drive circuit and a drive method for a dimming glass, and a dimming glass device.

BACKGROUND

A dimming glass is also called an electronic control dimming glass, an electronic control liquid crystal glass, or an intelligent dimming glass, etc., and the dimming glass is a functional laminated glass product formed by sandwiching a high-tech liquid crystal film between two glass layers and by performing high-temperature and high-pressure process-

SUMMARY

At least one embodiment of the present disclosure provides a drive circuit for a dimming glass, and the drive circuit comprises: a controller and a voltage adjustment circuit. An input terminal of the controller receives a control instruction, and the controller is configured to output a voltage control signal at an output terminal of the controller according to the control instruction; a control input terminal of the voltage adjustment circuit is connected to the output terminal of the controller, a power input terminal of the voltage adjustment circuit is connected to a first power supply, and a voltage output terminal of the voltage adjustment circuit is connected to a voltage input terminal of the dimming glass, and the voltage adjustment circuit is configured to generate an output voltage signal at the voltage output terminal of the voltage adjustment circuit according to the voltage control signal; and the output voltage signal adjusts light transmittance of the dimming glass by controlling a degree of deflection of liquid crystal molecules in the dimming glass.

For example, in the drive circuit provided by some embodiments of the present disclosure, the voltage adjustment circuit comprises a voltage adjustment sub-circuit and a voltage output sub-circuit. A control input terminal of the voltage adjustment sub-circuit receives the voltage control signal, a power input terminal of the voltage adjustment sub-circuit is connected to the first power supply to receive a first voltage signal, and the voltage adjustment sub-circuit is configured to output a second voltage signal at a voltage output terminal of the voltage adjustment sub-circuit according to the voltage control signal, a voltage of the first voltage signal is different from a voltage of the second voltage signal; and a voltage input terminal of the voltage output sub-circuit receives the second voltage signal and the voltage output sub-circuit is configured to output the output voltage signal at a voltage output terminal of the voltage output sub-circuit based on the second voltage signal to control the light transmittance of the dimming glass.

For example, in the drive circuit provided by some embodiments of the present disclosure, the first voltage signal and the second voltage signal are DC voltage signals.

For example, in the drive circuit provided by some embodiments of the present disclosure, the voltage output sub-circuit comprises a drive sub-circuit and an output sub-circuit. A voltage input terminal of the drive sub-circuit is connected to the output terminal of the controller to receive a drive control signal, a power input terminal of the drive sub-circuit is connected to a second power supply, and the drive sub-circuit is configured to amplify the drive control signal and output an amplified drive control signal at a voltage output terminal of the drive sub-circuit; a drive control terminal of the output sub-circuit is connected to the voltage output terminal of the drive sub-circuit to receive the amplified drive control signal, and a voltage input terminal of the output sub-circuit is connected to the voltage output terminal of the voltage adjustment sub-circuit to receive the second voltage signal, and the output sub-circuit is configured to, under control of the amplified drive control signal, output the output voltage signal at a voltage output terminal of the output sub-circuit according to the second voltage signal.

For example, in the drive circuit provided by some embodiments of the present disclosure, the controller outputs the drive control signal to the voltage input terminal of the drive sub-circuit according to a refresh frequency.

For example, in the drive circuit provided by some embodiments of the present disclosure, the output voltage signal output by the output sub-circuit is an AC voltage signal, an amplitude of the AC voltage signal is identical with an amplitude of the second voltage signal, and an alternate frequency of the AC voltage signal is identical with a refresh frequency of the controller.

For example, in the drive circuit provided by some embodiments of the present disclosure, the voltage output terminal of the drive sub-circuit comprises a first output terminal, a second output terminal, a third output terminal, and a fourth output terminal, the voltage output terminal of the output sub-circuit comprises a first voltage output terminal and a second voltage output terminal, the output sub-circuit comprises a first transistor, a second transistor, a third transistor, and a fourth transistor. A gate electrode of the first transistor is connected to the first output terminal of the drive sub-circuit to receive the amplified drive control signal, a first electrode of the first transistor is connected to the voltage output terminal of the voltage adjustment sub-circuit to receive the second voltage signal, and a second electrode of the first transistor is connected to the first voltage output terminal of the output sub-circuit; a gate electrode of the second transistor is connected to the second output terminal of the drive sub-circuit to receive the amplified drive control signal, a first electrode of the second transistor is connected to the voltage output terminal of the voltage adjustment sub-circuit to receive the second voltage signal, and a second electrode of the second transistor is connected to the second voltage output terminal of the output sub-circuit; a gate electrode of the third transistor is connected to the third output terminal of the drive sub-circuit to receive the amplified drive control signal, a first electrode of the third transistor is connected to a first voltage terminal to receive a third voltage signal, and a second electrode of the third transistor is connected to the first voltage output terminal of the output sub-circuit; and a gate electrode of the fourth transistor is connected to the fourth output terminal of the drive sub-circuit to receive the amplified drive control signal, a first electrode of the fourth transistor is connected to the first voltage terminal to receive the third voltage signal, and a second electrode of the fourth transistor is connected to the second voltage output terminal of the output sub-circuit.

For example, in the drive circuit provided by some embodiments of the present disclosure, the output sub-circuit further comprises a bootstrap circuit, a voltage input terminal of the bootstrap circuit is connected to the voltage output terminal of the output sub-circuit to receive the output voltage signal, and the bootstrap circuit is configured to control a voltage at the voltage input terminal of the output sub-circuit according to the output voltage signal.

For example, in the drive circuit provided by some embodiments of the present disclosure, the bootstrap circuit comprises: a first capacitor, a first diode, a second capacitor, and a second diode. A first terminal of the first capacitor is connected to the second electrode of the first transistor, and a second terminal of the first capacitor is connected to the gate electrode of the first transistor; a first electrode of the first diode is connected to the second power supply, and a second electrode of the first diode is connected to the gate electrode of the first transistor; a first terminal of the second capacitor is connected to the second electrode of the second transistor, and a second terminal of the second capacitor is connected to the gate electrode of the second transistor; and a first electrode of the second diode is connected to the second power supply, and a second electrode of the second diode is connected to the gate electrode of the second transistor.

For example, in the drive circuit provided by some embodiments of the present disclosure, the voltage adjustment sub-circuit comprises: a digitally controlled potentiometer, a resistor, and an analog-to-digital converter. A first terminal of the digitally controlled potentiometer serves as the control input terminal of the voltage adjustment sub-circuit and is connected to the output terminal of the controller to receive the voltage control signal, a second terminal of the digitally controlled potentiometer serves as the power input terminal of the voltage adjustment sub-circuit and is connected to the first power supply to receive the first voltage signal, and a third terminal of the digitally controlled potentiometer serves as the voltage output terminal of the voltage adjustment sub-circuit to output the second voltage signal; a first terminal of the resistor is connected to the third terminal of the digitally controlled potentiometer; and a first terminal of the analog-to-digital converter is connected to a second terminal of the resistor, and a second terminal of the analog-to-digital converter is connected to the digitally controlled potentiometer.

For example, the drive circuit provided by some embodiments of the present disclosure further comprises a filter circuit, the filter circuit is connected to the voltage output terminal of the output sub-circuit, and is configured to filter a DC voltage in the output voltage signal output by the output sub-circuit.

At least one embodiment of the present disclosure further provides a dimming glass device, comprising: the drive circuit according to any one of embodiments of the present disclosure and the dimming glass. The dimming glass comprises the liquid crystal molecules, is connected to the voltage output terminal of the drive circuit through a voltage input terminal of the dimming glass to receive the output voltage signal, and controls the degree of deflection of the liquid crystal molecules under control of the output voltage signal.

For example, in the dimming glass device provided by some embodiments of the present disclosure, the dimming glass further comprises: a first transparent substrate; and a second transparent substrate opposite to the first transparent substrate. The liquid crystal molecules are between the first transparent substrate and the second transparent substrate and are deflected under control of the output voltage signal output by the drive circuit.

For example, in the dimming glass device provided by some embodiments of the present disclosure, the liquid crystal molecules are dye liquid crystal molecules.

For example, the dimming glass device provided by some embodiments of the present disclosure further comprises a display unit, and the display unit is configured to display control information and send the control instruction to the controller according to an operation on the control information.

For example, the dimming glass device provided by some embodiments of the present disclosure further comprises a control unit, and the control unit is configured to send the control instruction to the controller.

For example, the dimming glass device provided by some embodiments of the present disclosure further comprises a button unit, and the button unit is configured to send the control instruction to the controller.

At least one embodiment of the present disclosure further provides a drive method for driving the drive circuit for a dimming glass according to any one of embodiments of the present disclosure, and the drive method comprises: receiving the control instruction, and by the controller, outputting the voltage control signal at the output terminal of the controller according to the control instruction; by the voltage adjustment circuit, generating the output voltage signal at the voltage output terminal of the voltage adjustment circuit according to the voltage control signal. The output voltage signal adjusts the light transmittance of the dimming glass by controlling the degree of deflection of the liquid crystal molecules in the dimming glass.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
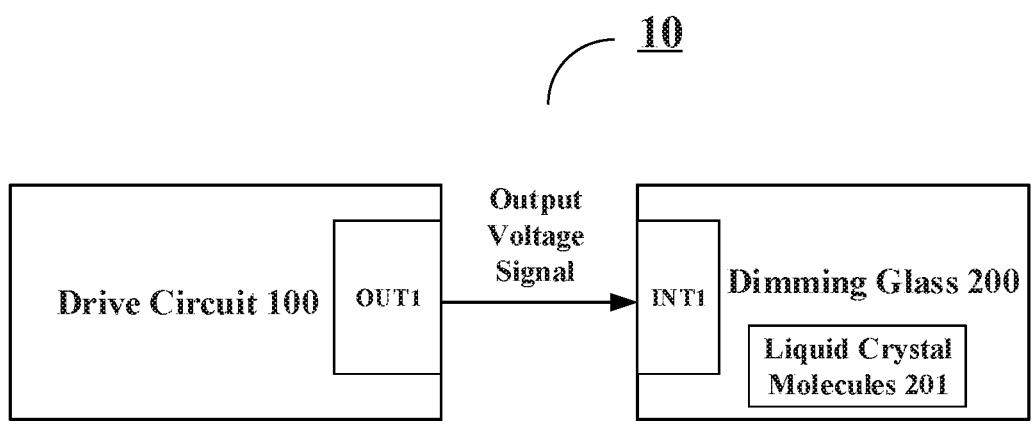
FIG. 1 is a schematic diagram of a dimming glass device provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be described below through some specific embodiments. In order to keep the following descriptions of the embodiments of the present disclosure clear and concise, detailed descriptions of known functions and known components may be omitted. In the case where any component of an embodiment of the present disclosure appears in more than one drawing, the component is indicated by the same or similar reference numeral in each drawing.

After adding dye to liquid crystal molecules of a dimming glass, by controlling the liquid crystal molecules to deflect, the light transmittance of the dimming glass can be changed, so that the brightness and the color of the dimming glass can be adjusted. Dye liquid crystal molecules are capacitive loads. For example, the dimming glass can be driven by an alternating current signal (AC signal) to avoid polarization of the dye liquid crystal. Because the light transmittance of the dimming glass is related to the degree of deflection of the dye liquid crystal molecules, and the degree of deflection of the dye liquid crystal molecules is related to the amplitude of the alternating current signal applied to the dimming glass, and therefore, how to provide an alternating current signal with an adjustable amplitude according to the requirement for the light transmittance of the dimming glass has become an urgent problem to be solved.

At least one embodiment of the present disclosure provides a drive circuit for a dimming glass, and the drive circuit comprises a controller and a voltage adjustment circuit. An input terminal of the controller receives a control instruction, and the controller is configured to output a voltage control signal at an output terminal of the controller according to the control instruction; a control input terminal of the voltage adjustment circuit is connected to the output terminal of the controller, a power input terminal of the voltage adjustment circuit is connected to a first power supply, and a voltage output terminal of the voltage adjustment circuit is connected to a voltage input terminal of the dimming glass, and the voltage adjustment circuit is configured to generate an output voltage signal at the voltage output terminal of the voltage adjustment circuit according to the voltage control signal; and the output voltage signal adjusts light transmittance of the dimming glass by controlling a degree of deflection of liquid crystal molecules in the dimming glass. At least one embodiment of the present disclosure also provides a dimming glass device and a drive method corresponding to the above drive circuit.

The drive circuit for the dimming glass provided by the above embodiments of the present disclosure can generate an alternating current signal with an adjustable amplitude according to needs, and control the degree of deflection of liquid crystal molecules in the dimming glass by the alternating current signal to adjust the light transmittance of the dimming glass, so that the brightness of the dimming glass can be adjusted, and the market competitiveness of the dimming glass is improved.

The embodiments and examples of the present disclosure will be described in detail below with reference to the drawings.

Some embodiments of the present disclosure provide a dimming glass device, the dimming glass device can adjust the light transmittance of the dimming glass by generating an alternating current signal with an adjustable amplitude, thereby achieving to adjust the brightness of the dimming glass. For example, the dimming glass device can be applied to various fields, such as automobiles, airplanes, motor cars, homes, shopping malls, and museums. The color and brightness of the dimming glass can be controlled by controlling an electrical signal applied to the dimming glass, so that an incident intensity of external light can be adjusted. The dimming glass device is equivalent to a curtain with an electronic control device. Not only the light transmittance can be changed freely, but also a structure and space for setting the curtain can be saved. FIG. 1 is a schematic diagram of a dimming glass device provided by some embodiments of the present disclosure. The dimming glass device provided by some embodiments of the present disclosure will be described in detail below with reference to FIG. 1.

As shown in FIG. 1, the dimming glass device 10 includes a drive circuit 100 and a dimming glass 200. For example, the drive circuit 100 is used to generate an output voltage signal that controls the brightness of the dimming glass 200 and output the output voltage signal at a voltage output terminal OUT1 of the drive circuit 100. For example, the dimming glass 200 includes liquid crystal molecules 201, a voltage input terminal INT1 of the dimming glass 200 is connected to the voltage output terminal OUT1 of the drive circuit 100 to receive the output voltage signal output from the voltage output terminal OUT1, and the dimming glass 200 controls a degree of deflection of the liquid crystal molecules 201 in the dimming glass 200 under control of the output voltage signal to adjust the light transmittance of the dimming glass, so that the brightness of the dimming glass can be changed as needed.

Figure 2:
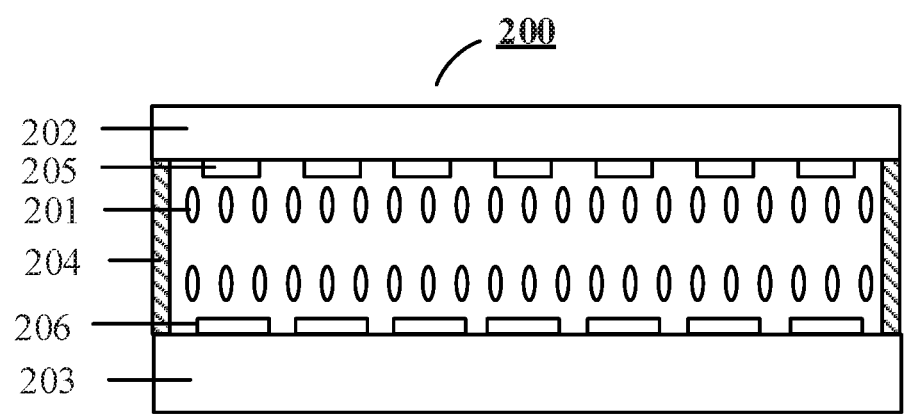
FIG. 2 is a schematic diagram of a dimming glass provided by some embodiments of the present disclosure.

FIG. 2 is a schematic diagram of a dimming glass provided by some embodiments of the present disclosure. That is, FIG. 2 is a structural schematic diagram of an example of the dimming glass 200 as shown in FIG. 1. As shown in FIG. 2, the dimming glass 200 includes: a first transparent substrate 202, a second transparent substrate 203, and a liquid crystal layer including the liquid crystal molecules 201. The first transparent substrate 202 and the second transparent substrate 203 are oppositely arranged, and for example, are aligned to each other through a sealant 204, and the liquid crystal molecules 201 are located between the first transparent substrate 202 and the second transparent substrate 203 and are deflected under the control of the output voltage signal output by the drive circuit 100.

For example, in some embodiments of the present disclosure, a material of the first transparent substrate 202 and a material of the second transparent substrate 203 may be the same or different, and may be transparent materials, such as glass materials, resin materials, etc., and may also be any combination of glass materials and resin materials, and the embodiments of the present disclosure are not limited thereto.

As shown in FIG. 2, the dimming glass 200 further includes a first drive electrode 205 and a second drive electrode 206. For example, the first drive electrode 205 is located on a side of the first transparent substrate 202 opposite to the second transparent substrate 203, and the second drive electrode 206 is located on a side of the second transparent substrate 203 opposite to the first transparent substrate 202. For example, the first drive electrode 205 and the second drive electrode 206 may be arranged horizontally or vertically, and an arrangement direction of the first drive electrode 205 and the second drive electrode 206 is not limited, as long as it is satisfied that the first drive electrode 205 and the second drive electrode 206 have overlapping portions to form an electric field to control the deflection of the liquid crystal molecules 201. For example, a material of the first drive electrode 205 and a material of the second drive electrode 206 may be transparent conductive materials. For example, the transparent conductive material may be a material including transparent metal oxide, such as indium tin oxide (ITO) or indium zinc oxide (IZO). For example, the first drive electrode 205 and the second drive electrode 206 may be strip electrodes or planar electrodes, and the embodiments of the present disclosure are not limited thereto.

For example, the first drive electrode 205 and the second drive electrode 206 are connected to the drive circuit 100 through the voltage input terminals INT1 (as shown in FIG. 1) located on a left side and a right side of the first transparent substrate 202 and the second transparent substrate 203, respectively, and the wires (not shown in the drawings) connected to the voltage input terminals INT1, so as to input corresponding output voltage signals to the first transparent substrate 202 and the second transparent substrate 203 to generate an electric field between the first drive electrode 205 and the second drive electrode 206, the deflection of the liquid crystal molecules 201 is controlled by the electric field, thereby achieving to adjust the light transmittance of the dimming glass and changing the brightness of the dimming glass.

For example, the liquid crystal molecules 201 may be dye liquid crystal molecules. For example, the liquid crystal molecules 201 may be negative dielectric anisotropic dye liquid crystals, or the like, the embodiments of the present disclosure do not limit this case.

Figure 3:
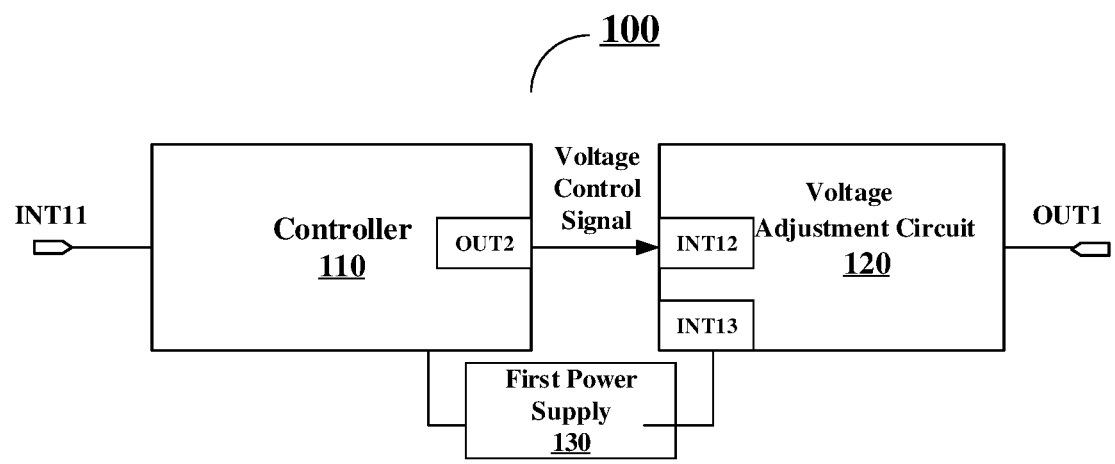
FIG. 3 is a schematic block diagram of a drive circuit provided by some embodiments of the present disclosure.

Some embodiments of the present disclosure also provide a drive circuit for a dimming glass. FIG. 3 is a schematic block diagram of a drive circuit provided by some embodiments of the present disclosure, that is, FIG. 3 is a schematic block diagram of the drive circuit 100 as shown in FIG. 1. As shown in FIG. 3, the drive circuit 100 includes a controller 110 and a voltage adjustment circuit 120.

For example, an input terminal INT11 of the controller 110 receives a control instruction, and the controller 110 is configured to output a voltage control signal at an output terminal OUT2 of the controller 110 according to the control instruction. For example, in some examples, the controller 110 may be implemented as a micro-chip unit (MCU). Of course, the controller 10 can also be implemented as other processing units, as long as related functions can be implemented, and the embodiments of the present disclosure do not limit this case. For example, the control instruction is an instruction to adjust the brightness of the dimming glass 200 to be brighter or to be lower, and the control instruction may be sent to the controller 110 through a mobile phone APP or a button device. For example, the controller 110 may also be connected to a first power supply to receive a first voltage signal.

Figure 4A:
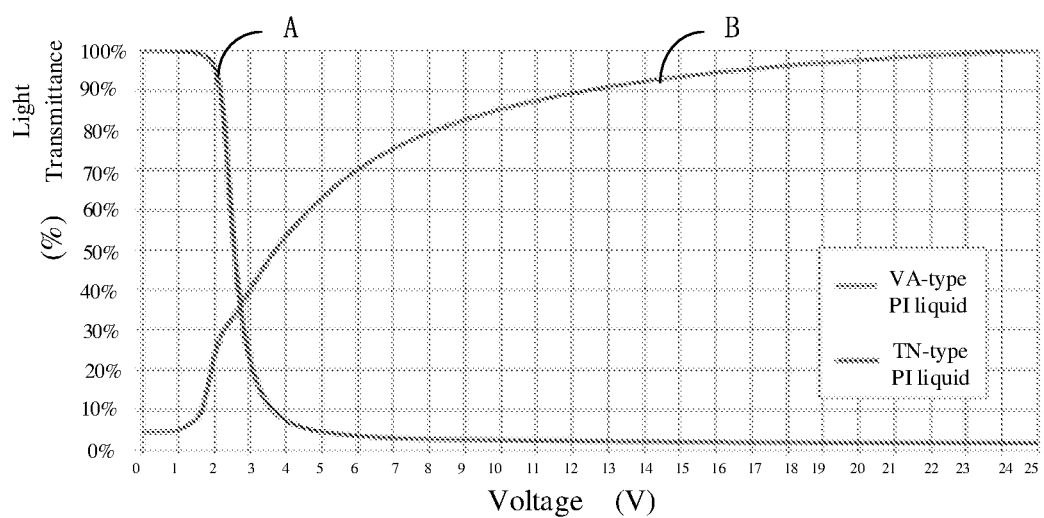
FIG. 4A is a diagram showing an example of a relationship between light transmittance of a dimming glass and a voltage applied to the dimming glass provided by some embodiments of the present disclosure.

For example, the specific form of the voltage control signal may be a pulse width modulation (PWM) signal, etc., and may depend on the actual situation, and the embodiments of the present disclosure do not limit this case. Because the brightness of the dimming glass 200 is related to the light transmittance of the dimming glass 200, the voltage control signal is a voltage signal corresponding to the light transmittance of the dimming glass 200 (that is, the brightness of the dimming glass 200). FIG. 4A is a diagram showing an example of a relationship between light transmittance of a dimming glass and a voltage applied to the dimming glass according to some embodiments of the present disclosure.

As shown in FIG. 4A, for different types of liquid crystal molecules, voltages applied to the first transparent substrate or the second transparent substrate corresponding to the same light transmittance are also different. For example, as shown in FIG. 4A, curve A represents a relationship between a degree of deflection of a twisted nematic (TN) type of dye liquid crystal and the applied voltage, and curve B represents a relationship between a degree of deflection of a vertical alignment (VA) type of dye liquid crystal and the applied voltage. For example, for the TN-type dye liquid crystal, as the voltage applied to the TN-type dye liquid crystal increases, the light transmittance of the dimming glass 200 becomes smaller; and for the VA-type dye liquid crystal, as the voltage applied to the VA-type dye liquid crystal increases, the light transmittance of the dimming glass 200 becomes larger.

According to the relationship between the voltage and the light transmittance as shown in FIG. 4A, in the case where the controller 110 receives, for example, a control instruction (for example, an instruction to adjust the light transmittance of the dimming glass 200 to 80%) sent from the mobile phone, the controller 110 can obtain a voltage control signal (for example, a PWM signal) corresponding to the voltage applied to the dimming glass 200 according to the graph in FIG. 4A, so that the controller 110 generates the voltage, that is, the voltage (that is, the output voltage signal), corresponding to the control instruction, as shown in FIG. 4, applied to the dimming glass 200 in a subsequent circuit (for example, the voltage adjustment circuit 120) according to the voltage control signal.

For example, a control input terminal INT12 of the voltage adjustment circuit 120 is connected to the output terminal OUT2 of the controller 110, a power input terminal INT13 of the voltage adjustment circuit 120 is connected to the first power supply 130 to receive the first voltage signal, and a voltage output terminal OUT1 of the voltage adjustment circuit 120 serves as the voltage output terminal OUT1 of the drive circuit and is connected to the voltage input terminal INT1 of the dimming glass 200 as shown in FIG. 1, and the voltage adjustment circuit 120 is configured to generate the output voltage signal at the voltage output terminal OUT1 of the voltage adjustment circuit 120 according to the voltage control signal. For example, the output voltage signal adjusts the light transmittance (or light transmittance rate) of the dimming glass 200 by controlling the degree of deflection of the liquid crystal molecules 201 in the dimming glass 200.

For example, in some embodiments of the present disclosure, the first power supply is a DC voltage source, the first voltage signal provided by the first power supply is a DC voltage signal, and the output voltage signal may be an AC voltage signal or a DC voltage signal. Because the dye liquid crystal molecules are capacitive loads, in order to avoid polarization of the dye liquid crystal molecules, the output voltage signal may be an AC voltage signal, but the embodiments of the present disclosure are not limited to this case. For example, the voltage adjustment circuit 120 can convert the first voltage signal (e.g., DC voltage signal) into the output voltage signal (e.g., AC voltage signal) according to the voltage control signal, so as to drive the dimming glass.

Figure 4B:
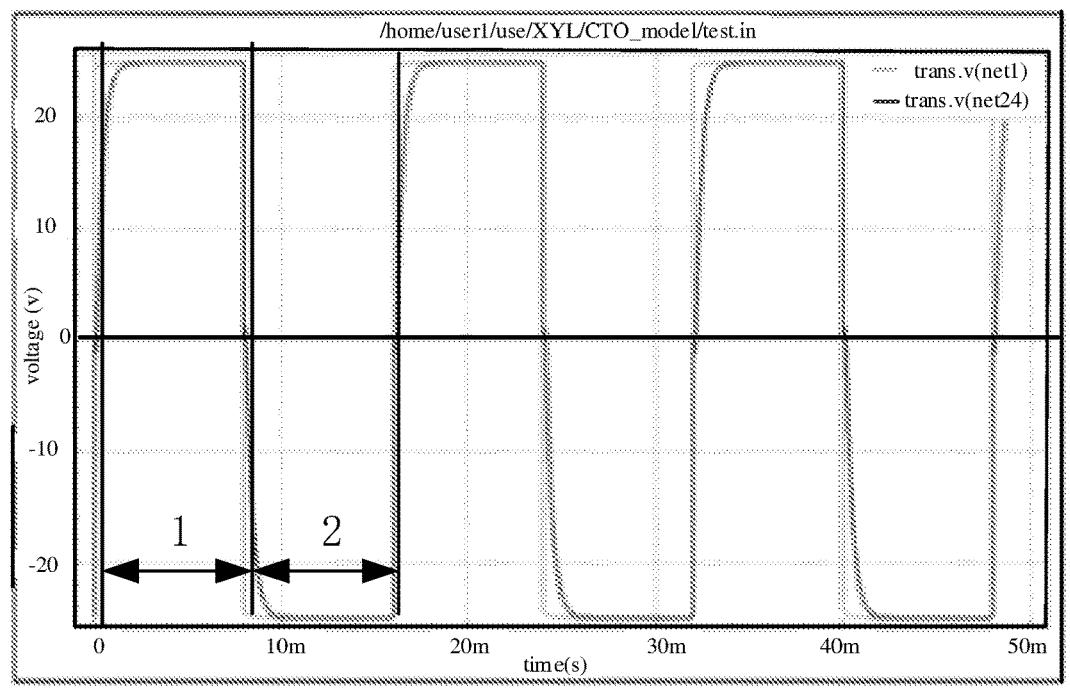
FIG. 4B is a waveform diagram of an example of an output voltage signal provided by some embodiments of the present disclosure.

FIG. 4B is a waveform diagram of an example of an output voltage signal provided by some embodiments of the present disclosure. As shown in FIG. 4B, the output voltage signal is an AC voltage signal. The specific generation process of the output voltage signal will be described in detail below, and the description of the specific generation process will not be repeated here again.

The dimming glass device provided by the above embodiments of the present disclosure can generate an alternating current signal with an adjustable amplitude according to needs, and control the degree of deflection of liquid crystal molecules in the dimming glass by the alternating current signal to adjust the light transmission of the dimming glass, so that the brightness of the dimming glass can be adjusted, and the market competitiveness of the dimming glass is improved.

Figure 5:
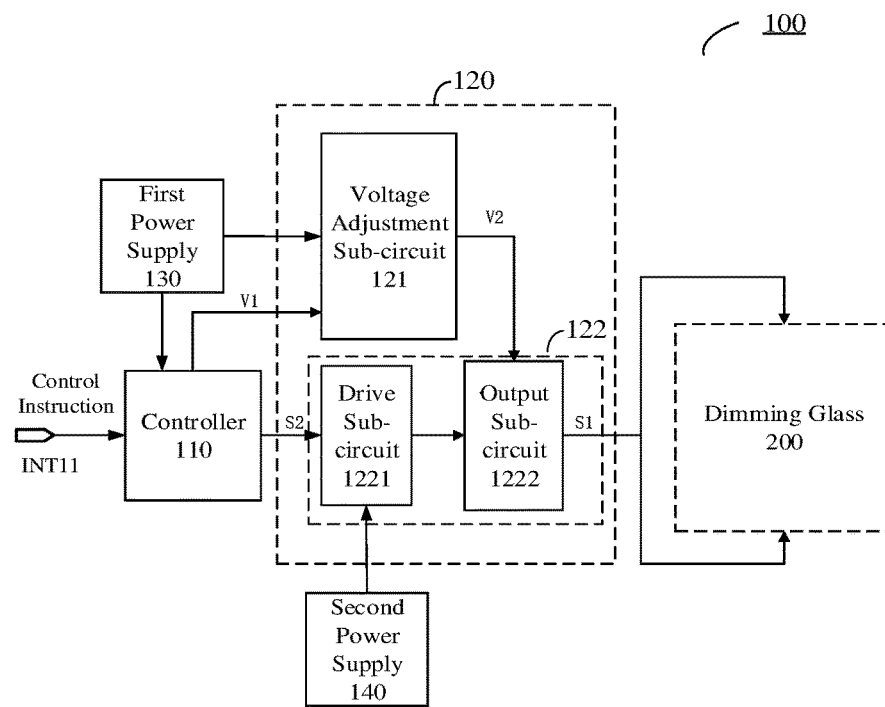
FIG. 5 is a structural schematic diagram of a drive circuit in another dimming glass device provided by some embodiments of the present disclosure.

FIG. 5 is a structural schematic diagram of a drive circuit in another dimming glass device provided by some embodiments of the present disclosure. For example, as shown in FIG. 5, in some examples, the voltage adjustment circuit 120 includes a voltage adjustment sub-circuit 121 and a voltage output sub-circuit 122.

For example, a control input terminal (not shown in the figure) of the voltage adjustment sub-circuit 121 receives the voltage control signal V1 output from the controller 110, and a power input terminal (not shown in the figure) of the voltage adjustment sub-circuit 121 is connected to the first power supply 130 to receive the first voltage signal (DC voltage signal), and the voltage adjustment sub-circuit is configured to output the second voltage signal V2 at a voltage output terminal (not shown in the figure) of the voltage adjustment sub-circuit according to the voltage control signal V1. For example, a voltage of the first voltage signal is different from a voltage of the second voltage signal, and the voltage of the second voltage signal is the same as a voltage of the output voltage signal.

For example, in some examples, in the case where the light transmittance of the dimming glass including the VA-type dye liquid crystal molecules as shown in FIG. 4A is adjusted to 80%, it can be known from the curve B in FIG. 4A that the voltage adjustment circuit 120 needs to generate an output voltage signal with an amplitude of 8V, that is, a second voltage signal V2 of 8V needs to be generated. For example, in order to ensure the normal operation of the circuit, the first voltage signal V1 provided by the first power supply may be set to 27V, so that the first voltage signal (DC voltage signal) of, for example, 27V may be adjusted to, for example, the second voltage signal (DC voltage signal) of 8V by the voltage adjustment sub-circuit 121.

Figure 6A:
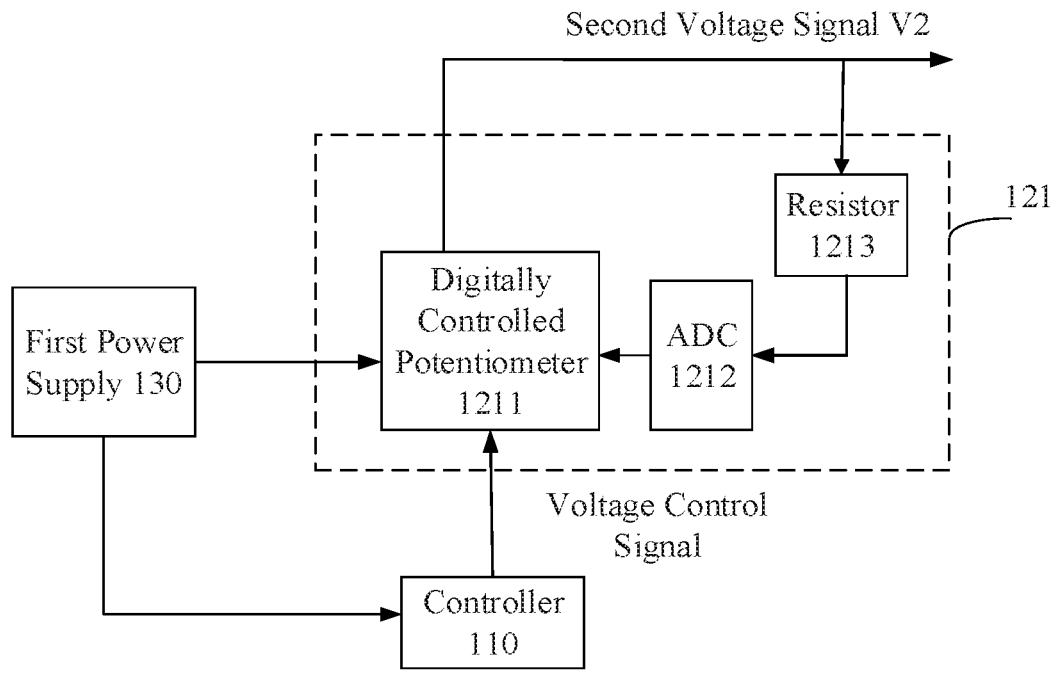
FIG. 6A is a structural schematic diagram of an example of a voltage adjustment sub-circuit provided by some embodiments of the present disclosure.

For example, as shown in FIG. 6A, the voltage adjustment sub-circuit 121 includes a digitally controlled potentiometer 1211, an ADC (digital-to-analog converter) 1212, and a resistor 1213.

For example, a first terminal of the digitally controlled potentiometer 1211 serves as the control input terminal of the voltage adjustment sub-circuit 121 and is connected to the output terminal of the controller 110 to receive the voltage control signal (e.g., PWM), a second terminal of the digitally controlled potentiometer 1211 serves as the power input terminal of the voltage adjustment sub-circuit 121 and is connected to the first power supply 130 to receive the first voltage signal, and a third terminal of the digitally controlled potentiometer 1211 serves as the voltage output terminal of the voltage adjustment sub-circuit 121 and outputs the second voltage signal. For example, the digitally controlled potentiometer may convert the first voltage signal input by the first power supply 130 into the second voltage signal corresponding to the light transmittance according to the voltage control signal and output the second voltage signal. For example, in some examples, the digitally controlled potentiometer may be implemented as a variable resistor, and the embodiments of the present disclosure are not limited to this case.

For example, a first terminal of the resistor 1213 is connected to the third terminal of the digitally controlled potentiometer 1211. For example, the resistor is a feedback resistor, and may feedback the second voltage signal output by the digitally controlled potentiometer 1211 to the digitally controlled potentiometer 1211. A value of the resistor 1213 may be determined according to actual conditions, and the embodiments of the present disclosure is not limited thereto.

For example, a first terminal of the analog-to-digital converter 1212 is connected to a second terminal of the resistor 1213, and a second terminal of the analog-to-digital converter 1212 is connected to the digitally controlled potentiometer 1211. For example, the analog-to-digital converter 1212 is used to sample the second voltage signal V2 transmitted from the feedback resistor 1213 and feed the second voltage signal V2 back to the digitally controlled potentiometer. The digitally controlled potentiometer 1211 can be further adjusted according to the feedback voltage signal, so that the digitally controlled potentiometer 1211 can output a more accurate second voltage signal.

For example, the structure of the voltage adjustment sub-circuit 121 is not limited to the circuit as shown in FIG. 6A, the voltage adjustment sub-circuit 121 can also be implemented as other structures in the art, the structure of the voltage adjustment sub-circuit 121 is not repeated here again.

Figure 7A:
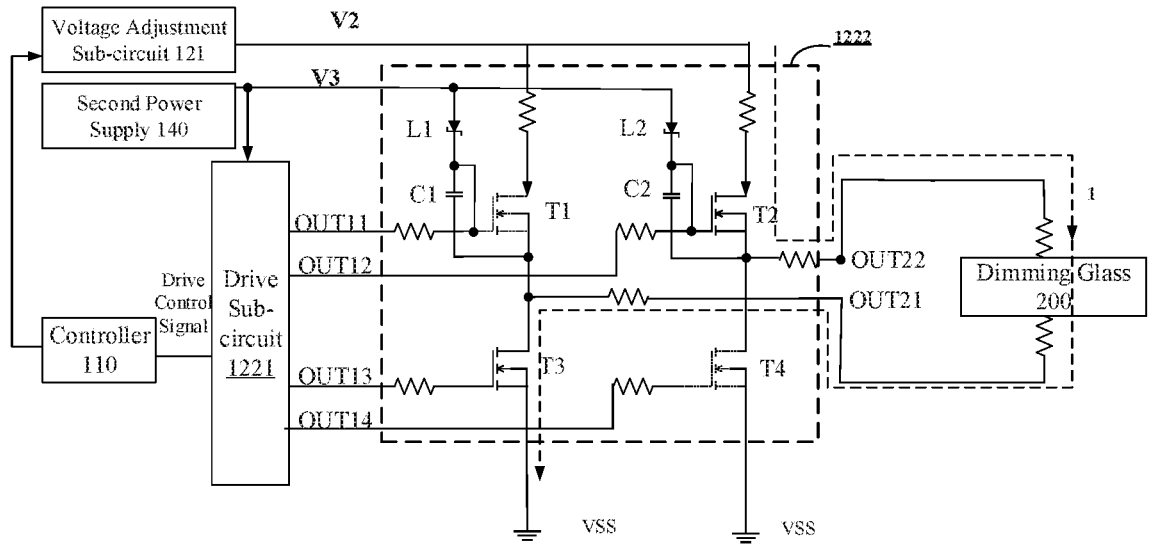
FIG. 7A is a schematic diagram in the case where the output sub-circuit as shown in FIG. 6B is in a first stage as shown in FIG. 4B.
Figure 7B:
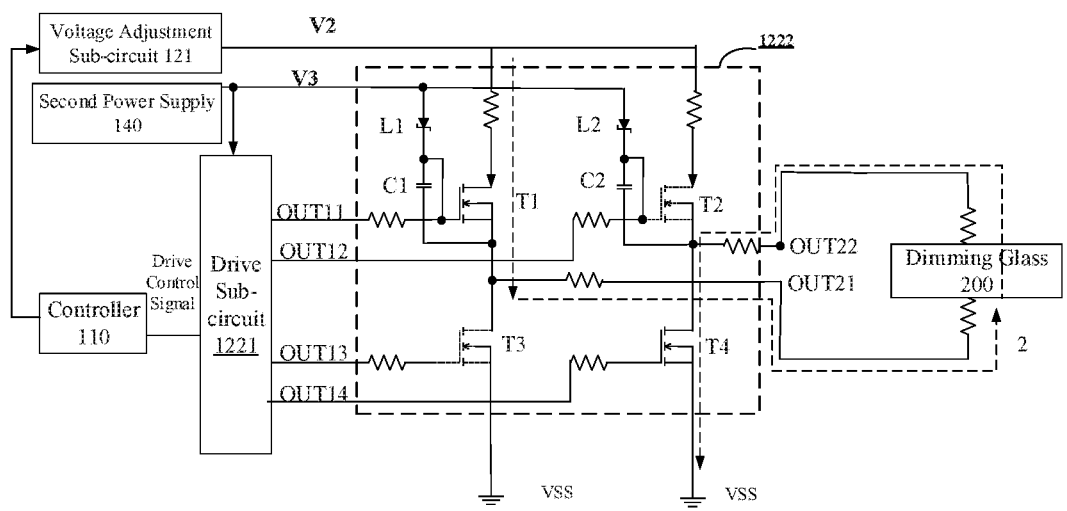
FIG. 7B is a schematic diagram in a case where the output sub-circuit shown in FIG. 6B is in a second stage shown in FIG. 4B.

For example, the voltage input terminal (not shown in the figure) of the voltage output sub-circuit 122 receives the second voltage signal, and the voltage output sub-circuit 122 is configured to output the output voltage signal S1 at the voltage output terminal (not shown in the figure) of the voltage output sub-circuit 122 based on the second voltage signal to control the light transmittance of the dimming glass 200. For example, the voltage output sub-circuit 122 may be connected to the output terminal of the controller 110 (not shown in the figure) and the output terminal of the voltage adjustment sub-circuit 121 (not shown in the figure), and is configured to be turned on under control of the drive control signal S2 output from the output terminal of the controller 110, so that the output terminal (not shown in the figure) of the voltage output sub-circuit 122 is connected to the output terminal (not shown in the figure) of the voltage adjustment sub-circuit 121 to output the second voltage signal to the dimming glass 200. For example, the voltage output sub-circuit 122 may also control a polarity of the voltage applied to the dimming glass 200 under the control of the drive control signal S2 output from the output terminal of the controller 110. As shown in FIGS. 7A and 7B below, for example, the polarity of the voltage applied to the dimming glass 200 as shown in FIG. 7A is positive (for example, corresponding to a square wave in a first stage 1 in FIG. 4B), and a current flow of the voltage is represented by, for example, a dotted line 1 with an arrow as shown in FIG. 7A;

for example, the polarity of the voltage applied to the dimming glass 200 as shown in FIG. 7B is negative (for example, corresponding to a negative square wave in a second stage 2 in FIG. 4B), and a current flow of the voltage is represented by, for example, a dotted line 2 with an arrow as shown in FIG. 7B, the details will be described in detail below and will not be repeated here again.

For example, the controller 110 may send drive control signals corresponding to voltages of different polarities of the dimming glass 200 to the voltage output sub-circuit 122 at a refresh frequency, and control the second voltage signal to change the polarity at the refresh frequency to generate a waveform diagram as shown in FIG. 4B, so that the electric field applied to the dye liquid crystal in the dimming glass can be changed at the refresh frequency, to avoid the polarization phenomenon of the liquid crystal under the electric field in the same direction for a long time and avoid affecting the normal operation of the dimming glass.

For example, the refresh frequency is used to control the alternating time of the positive polarity voltage and the negative polarity voltage applied to the dimming glass 200 (for example, a width of the AC square wave signal as shown in FIG. 4B), so that the positive polarity voltage and the negative polarity voltage can be alternately applied to the dimming glass 200 at the refresh frequency, so as to prevent the liquid crystal molecules from being polarized under the control of the voltage of one polarity for a long time. For example, the refresh frequency can be set before shipment, and the specific setting value can be determined according to the specific situation, as long as it can satisfy that the refresh frequency does not affect the human eye sensory, for example, the refresh frequency can be 60 Hertz (HZ), and the embodiments of the present disclosure are not limit to the specific value of the refresh frequency.

For example, in the case where the refresh frequency is 60 Hz, in a first refresh stage (for example, a first $\frac{1}{60}$ s), the controller 110 provides a first drive control signal to the voltage adjustment sub-circuit 122 to generate a positive polarity voltage; and in a second refresh stage (for example, a second $\frac{1}{60}$s), the controller 110 provides a second drive control signal to the voltage adjustment sub-circuit 122 to generate a negative polarity voltage, thereby outputting voltage signals with alternating polarities to the dimming glass.

For example, a level of the drive control signal changes alternately at the refresh frequency.

Because the alternating frequency of the level of the output voltage signal S1 is related to the frequency at which the controller 110 sends the drive control signal S2, therefore, for example, the alternating frequency of the output voltage signal S1 is the same as the refresh frequency of the controller 110. For example, the specific working process of the voltage output sub-circuit 122 will be described in detail below and will not be repeated here again.

For example, the voltage output sub-circuit 122 can generate an AC voltage signal that drives liquid crystal molecules to deflect, and for example, adjust the second voltage signal V2 (a DC voltage signal with an amplitude of 8V) to an output voltage signal S1 (an AC voltage signal with an amplitude of 8V), so that the output voltage signal S1 can be output to the dimming glass 200 to control the dye liquid crystal molecules in the dimming glass 200 to be deflected accordingly.

For example, in other examples, the voltage output sub-circuit 122 includes a drive sub-circuit 1221 and an output sub-circuit 1222.

For example, a voltage input terminal (not shown in the figure) of the drive sub-circuit 1221 is connected to the output terminal (not shown in the figure) of the controller 110 to receive the drive control signal S2, and a power input terminal (not shown in the figure) of the drive sub-circuit 1221 is connected to a second power supply 140. The drive sub-circuit 1221 is configured to amplify the drive control signal and output an amplified drive control signal at the voltage output terminal (not shown in the figure) of the drive sub-circuit 1221. For example, due to the limitation of the drive capability of the controller 110, the drive control signal S2 output from the output terminal of the controller 110 is insufficient to drive the output sub-circuit 1222. Therefore, the drive sub-circuit 1221 can perform, for example, the amplification processing and the like on the drive control signal output by the controller 11, so that the voltage output by the drive sub-circuit 1221 can enable the output sub-circuit 1222 work normally.

It should be noted that the drive sub-circuit can be implemented by a circuit structure in the art, for example, the drive sub-circuit can be implemented by two H-bridge circuits, and detail portions will not be repeated herein.

For example, in order to enable the drive sub-circuit to achieve to output a lower voltage (for example, a voltage below 5V), an independent power supply may be used to provide power, for example, the second power supply 140 is used to provide power for the drive sub-circuit 1221. For example, a voltage provided by the second power supply is less than a voltage provided by the first power supply, so that the drive sub-circuit 1221 can achieve to output a lower voltage under the driving of the second power supply 140.

For example, the drive control terminal (not shown in the figure) of the output sub-circuit 1222 is connected to the voltage output terminal (not shown in the figure) of the drive sub-circuit 1221 to receive the amplified drive control signal, and the voltage input terminal (not shown in the figure) of the output sub-circuit 1222 is connected to the voltage output terminal (not shown in the figure) of the voltage adjustment sub-circuit 121 to receive the second voltage signal V2, and the output sub-circuit 1222 is configured to, under the control of the amplified drive control signal, output the output voltage signal S1 at the voltage output terminal (not shown in the figure) of the output sub-circuit 1222 according to the second voltage signal. For example, the output sub-circuit 1222 is turned on under the control of the amplified drive control signal, so that the voltage output terminal (not shown in the figure) of the voltage adjustment sub-circuit 121 is connected to the voltage output terminal (not shown in the figure) of the output sub-circuit 1222, thereby outputting the second voltage signal to the dimming glass 200.

For example, the controller 110 outputs the drive control signal to the voltage input terminal (not shown in the figure) of the drive sub-circuit 1221 according to the refresh frequency.

Figure 6B:
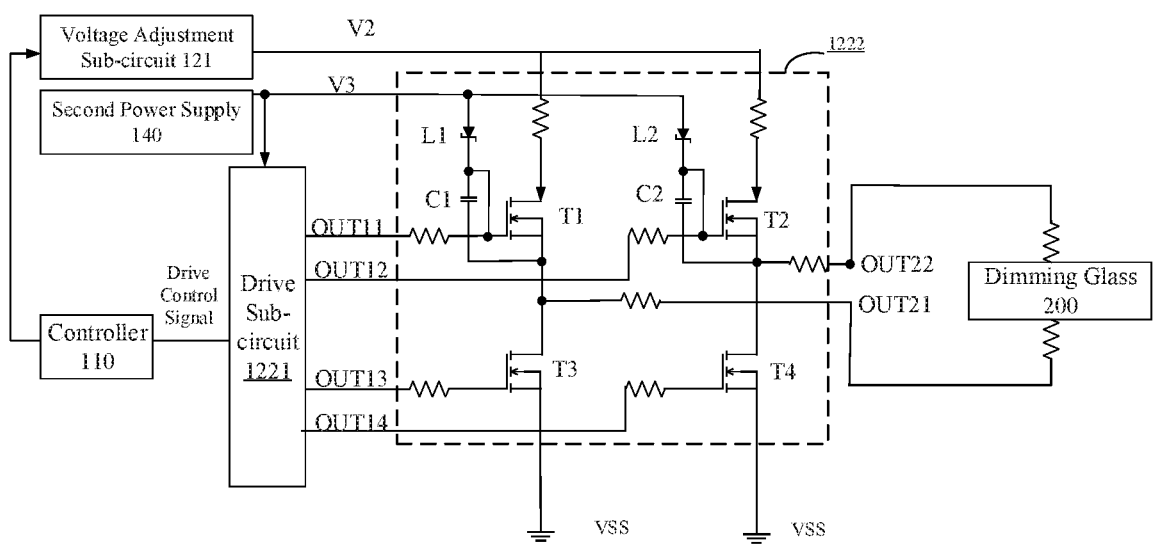
FIG. 6B is a circuit diagram of a specific implementation example of an output sub-circuit in a dimming glass device provided by some embodiments of the present disclosure.

FIG. 6B is a circuit diagram of a specific implementation example of an output sub-circuit in a dimming glass device provided by some embodiments of the present disclosure. For example, as shown in FIG. 6B, in this example, the voltage output terminal (not shown in the figure) of the drive sub-circuit 1221 includes a first output terminal OUT11, a second output terminal OUT12, a third output terminal OUT13, and a fourth output terminal OUT14, and the voltage output terminal (not shown in the figure) of the output sub-circuit 1222 includes a first voltage output terminal OUT21 and a second voltage output terminal OUT22. For example, the first voltage output terminal OUT21 of the output sub-circuit 1222 is connected to the first drive electrode on the first transparent substrate 202 of the dimming glass 200, and the second voltage output terminal OUT22 of the output sub-circuit 1222 is connected to the second drive electrode on the second transparent substrate 203 of the dimming glass 200, and the embodiments of the present disclosure are not limited in this aspect.

As shown in FIG. 6B, in some examples, the output sub-circuit 1222 may be implemented as an H-bridge circuit. For example, the H-bridge circuit includes a first transistor T1 to a fourth transistor T4. It should be noted that in the following description, taking a case that each transistor is an N-type transistor as an example, but this case does not constitute a limitation on the embodiments of the present disclosure.

For example, a gate electrode of the first transistor T1 is connected to the first output terminal OUT11 of the drive sub-circuit 1221 to receive the amplified drive control signal, a first electrode of the first transistor T1 is connected to the voltage output terminal (not shown in the figure) of the voltage adjustment sub-circuit 121 to receive the second voltage signal V2, and a second electrode of the first transistor T1 is connected to the first voltage output terminal OUT21 of the output sub-circuit 1222, and therefore, in the case where the first transistor T1 is turned on in response to the amplified drive control signal output from the first output terminal OUT11 of the drive sub-circuit 1221, so that the first voltage output terminal OUT21 is connected to the voltage output terminal (not shown in the figure) of the voltage adjustment sub-circuit 121, thereby outputting the second voltage signal V2 from the first voltage output terminal OUT21.

For example, a gate electrode of the second transistor T2 is connected to the second output terminal OUT12 of the drive sub-circuit 1221 to receive the amplified drive control signal, a first electrode of the second transistor T2 is connected to the voltage output terminal (not shown in the figure) of the voltage adjustment sub-circuit 121 to receive the second voltage signal V2, and a second electrode of the second transistor T2 is connected to the second voltage output terminal OUT22 of the output sub-circuit 1222, and therefore, in the case where the second transistor T2 is turned on in response to the amplified drive control signal output from the second output terminal OUT12, the second voltage output terminal OUT22 is connected to the voltage output terminal (not shown in the figure) of the voltage adjustment sub-circuit 121, thereby outputting the second voltage signal V2 from the second voltage output terminal OUT22.

For example, a gate electrode of the third transistor T3 is connected to the third output terminal OUT13 of the drive sub-circuit 1221 to receive the amplified drive control signal, a first electrode of the third transistor T3 is connected to the first voltage terminal VSS (e.g., a ground terminal, providing a low-level DC signal) to receive a third voltage signal (for example, a low-level DC signal, which is lower than the first voltage signal, and for example, is 0V), and a second electrode of the third transistor T3 is connected to the first voltage output terminal OUT21 of the output sub-circuit 1222, and therefore, in the case where the third transistor T3 is turned on in response to the amplified drive control signal output from the third output terminal OUT13, the first voltage output terminal OUT21 is connected to the first voltage terminal.

For example, a gate electrode of the fourth transistor T4 is connected to the fourth output terminal OUT14 of the drive sub-circuit 1221 to receive the amplified drive control signal, a first electrode of the fourth transistor T4 is connected to the first voltage terminal VSS to receive the third voltage signal, and a second electrode of the fourth transistor T4 is connected to the second voltage output terminal OUT22 of the output sub-circuit 1222, and therefore, in the case where the fourth transistor T4 is turned on in response to the amplified drive control signal output from the fourth output terminal OUT14, the second voltage output terminal OUT22 is connected to the first voltage terminal. For clarity and conciseness, the connection line between the first voltage terminal VSS and the first voltage terminal VSS is omitted in the figure.

FIG. 7A is a schematic diagram in the case where the output sub-circuit 1222 (for example, a H-bridge circuit) as shown in FIG. 6B is in the first stage as shown in FIG. 4B, and FIG. 7B is a schematic diagram in the case where the output sub-circuit 1222 (for example, a H-bridge circuit) as shown in FIG. 6B is in the second stage as shown in FIG. 4B. For example, in the first stage 1, control levels provided by the first output terminal OUT11 to the fourth output terminal OUT14 are 0, 1, 1, and 0, respectively; and in the second stage 2, control levels provided by the first output terminal OUT11 to the fourth output terminal OUT14 are 1, 0, 0, and 1, respectively. For example, 1 indicates a high level and 0 indicates a low level. For example, the levels 0110 or 1001 provided by the first output terminal OUT11—the fourth output terminal OUT14 are drive control signals amplified by the drive sub-circuit 1221, respectively, that is, the controller 110 outputs a level signal of 0110 or 1001 correspondingly through a corresponding interface, but a level of the level signal is lower, and therefore, the level signal is sent to the drive sub-circuit, after the level signal is amplified by the drive sub-circuit 1221, the amplified level signal is output from the first output terminal OUT11—the fourth output terminal OUT14.

In addition, transistors marked with dotted lines in FIGS. 7A to 7B indicate that the transistors are in a turn-off state during the corresponding stage, and the dotted lines with arrows in FIGS. 7A to 7B indicate a direction of the current flowing through the dimming glass 200 in the corresponding stage. In the transistors as shown in FIGS. 7A to 7B, the first transistor T1 and the fourth transistor T4 are N-type transistors. That is, respective N-type transistors are turned on in the case where a gate electrode of each N-type transistor receives a high level, and is turned off in the case where the gate electrode of each N-type transistor receives a low level. This case can be applied to the following embodiments, and similar portions will not be repeated herein.

For example, as shown in FIGS. 4B and 7A, in the first stage 1, the first transistor T1 and the fourth transistor T4 are turned off, and the second transistor T2 and the third transistor T3 are turned on in response to the high levels output by the second output terminal OUT12 and the third output terminal OUT13, respectively, so that the second voltage output terminal OUT22 is connected to the voltage output terminal (not shown in the figure) of the voltage adjustment sub-circuit 121, the first voltage output terminal OUT21 is connected to the first voltage terminal, so that the second voltage signal provided by the voltage adjustment sub-circuit 121 can be applied from the second voltage output terminal OUT22 to the second drive electrode on the second transparent substrate 203 of the dimming glass 200, and can flow out from the first voltage output terminal OUT21 connected to the first drive electrode 205 on the first transparent substrate 202 of the dimming glass 200 via the third transistor T3, thereby forming a current loop 1 as shown by the dotted line with an arrow in FIG. 7A, for example, the voltage waveform in this direction is a positive square wave in the first stage 1 as shown in FIG. 4B.

For example, as shown in FIGS. 4B and 7B, in the second stage 2, the second transistor T2 and the third transistor T3 are turned off, and the first transistor T1 and the fourth transistor T4 are turned on in response to the high levels output from the first output terminal OUT11 and the fourth output terminal OUT14, respectively, so that the first voltage output terminal OUT21 is connected to the voltage output terminal (not shown in the figure) of the voltage adjustment sub-circuit 121, the second voltage output terminal OUT22 is connected to the first voltage terminal, and therefore, the second voltage signal provided by the voltage adjustment sub-circuit 121 can be applied to the first drive electrode 205 on the first transparent substrate 202 of the dimming glass 200 from the first voltage output terminal OUT21, and flow out from the second voltage output terminal OUT22 connected to the second drive electrode 206 on the second transparent substrate 203 of the dimming glass 200 via the fourth transistor T4, thereby forming a current loop 2 as shown by the dotted line with an arrow in FIG. 7B, for example, the voltage waveform in this direction is a negative square wave in the second stage 2 as shown in FIG. 4B.

As described above, according to a principle of the H-bridge circuit, because the first transistor T1 and the fourth transistor T4 are turned on at the same time, the second transistor T2 and the third transistor T3 are turned on at the same time, and the two groups of transistors are turned on at different stages, so that the electric field applied to the dimming glass 200 changes, thereby achieving to convert the second voltage signal V2 that is output into an AC output voltage signal, avoiding the dye liquid crystal from being polarized under the electric field in the same direction for a long time, and ensuring that the dimming glass 200 works normally.

For example, in the case where the refresh frequency of the controller 110 is 60 Hz, it is possible to control, for example, the level signals 0110 and 1001 to be alternately output at this frequency, thereby generating an AC square wave signal as shown in FIG. 4B.

For example, in the case where the second voltage signal input to the first electrode of the first transistor T1 and the first electrode of the second transistor T2 is greater than the amplified drive control signals output from the first output terminal OUT11 and the second output terminal OUT12 to the gate electrode of the first transistor T1 and the gate electrode of the second transistor T2, respectively, it may cause that the first transistor T1 and the second transistor T2 are turned off at a stage when the first transistor T1 and the second transistor T2 should be turned on, thereby affecting the normal operation of the circuit.

In order to improve the reliability and stability of the circuit, the output sub-circuit 1222 in the drive circuit 100 provided by some embodiments of the present disclosure may further include a bootstrap circuit (not shown in the figure). For example, a voltage input terminal of the bootstrap circuit is connected to the voltage output terminal of the output sub-circuit 1222 to receive the output voltage signal, and the bootstrap circuit is configured to control the voltage of the voltage input terminal of the output sub-circuit 1222 according to the output voltage signal. That is, in the case where the voltage of the second electrode of the first transistor T1 or the second transistor T2 becomes the voltage of the first electrode of the first transistor T1 or the second transistor T2 (in the case where the transistor is turned on, the voltage of the second electrode is equal to the voltage of the first electrode), the voltage of the gate electrode of the first transistor T1 or the second transistor T2 will be bootstrap according to the voltage at the second electrode of the first transistor T1 or the second transistor T2 (that is, to maintain a difference Vgs between the voltage at the gate electrode of the first transistor T1 or the second transistor T2 and the voltage at the second electrode of the first transistor T1 or the second transistor T2 unchanged), so that the voltage at the gate electrode of the first transistor T1 or the second transistor T2 is greater than the voltage at the first electrode of the first transistor T1 or the second transistor T2, and the phenomenon that the first transistor T1 and the second transistor T2 are turned off at the stage when the first transistor T1 and the second transistor T2 should be turned on does not occur, thereby improving the reliability and stability of the circuit.

For example, as shown in FIG. 6B, the bootstrap circuit may be implemented as a first capacitor C1, a first diode L1, a second capacitor C2, and a second diode L2. For example, the first capacitor C1 and the first diode L1 are used to achieve the bootstrap of the first transistor T1, and the second capacitor C2 and the second diode L2 are used to achieve the bootstrap of the second transistor T2.

For example, a first terminal of the first capacitor C1 is connected to the second electrode of the first transistor T1, and a second terminal of the first capacitor C1 is connected to the gate electrode of the first transistor T1. A first electrode of the first diode L1 is connected to the second power supply 140, and a second electrode of the first diode L1 is connected to the gate electrode of the first transistor T1. A first terminal of the second capacitor C2 is connected to the second electrode of the second transistor T2, and a second terminal of the second capacitor C2 is connected to the gate electrode of the second transistor T2. A first electrode of the second diode L2 is connected to the second power supply 140, and a second electrode of the second diode L2 is connected to the gate electrode of the second transistor T2.

Figure 8:
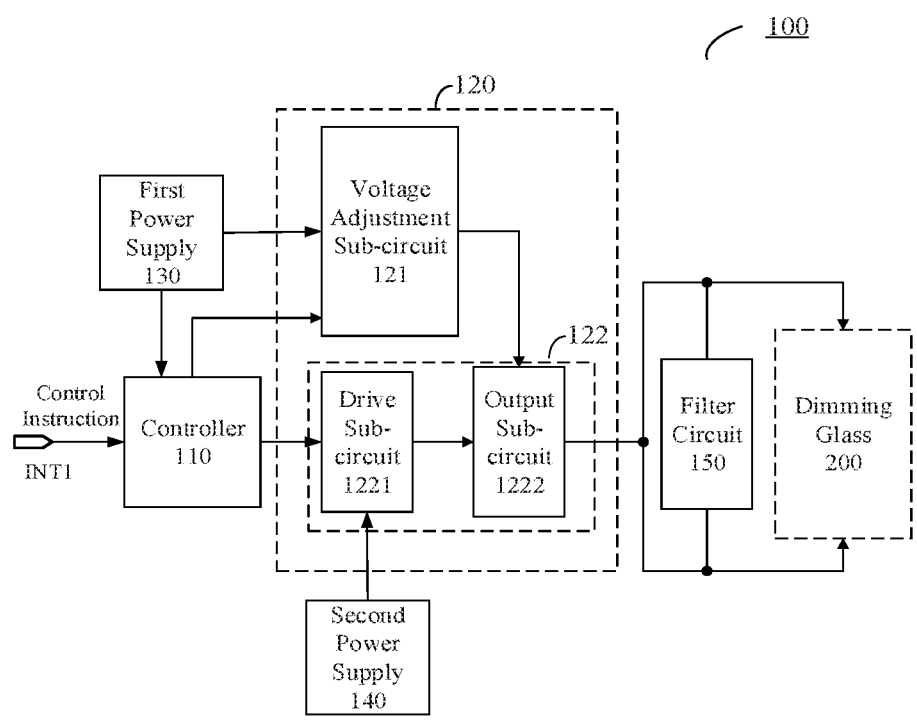
FIG. 8 is a structural schematic diagram of yet another dimming drive device provided by some embodiments of the present disclosure.

FIG. 8 is a structural schematic diagram of yet another dimming drive device provided by some embodiments of the present disclosure. For example, as shown in FIG. 8, based on the example shown in FIG. 5, the drive circuit 100 further includes a filter circuit 150. The filter circuit 150 can filter out a DC voltage component included in the second voltage signal, so that the voltage output to the dimming glass is more accurate. In addition, the filter circuit 150 can also reduce the power consumption of the dimming glass device.

For example, the filter circuit 150 is connected to the voltage output terminal (for example, the first voltage output terminal and the second voltage output terminal) of the output sub-circuit 1222, or to the first transparent substrate and the second transparent substrate of the dimming glass 200, and the filter circuit 150 is configured to filter the DC voltage in the output voltage signal output by the output sub-circuit 1222.

For example, in some examples, the filter circuit may be implemented as a resistor R; and in other examples, the filter circuit 150 may also be implemented as a resistor R and an inductor L. For example, a resistance value of the resistor R may be determined according to specific circumstances, and the embodiments of the present disclosure are not limited to this case.

Because the filter circuit 150 can be implemented as a resistor R or a resistor R and an inductor L, the filter circuit 150 can be connected in parallel with the dye liquid crystal molecules presenting a capacitive load in the dimming glass to form a high-impedance circuit, which exhibits a high-resistance characteristic, that is, the high-impedance circuit can be equivalent to a resistor. For example, after the deflection of the dye liquid crystal in the dimming glass is completed under the control of the output voltage signal, during the process when the output voltage signal is discharged from the first transparent substrate or the second transparent substrate, the charges can be stored in the inductor of the filter circuit 150 and are discharged when the dimming glass 200 is subsequently driven, thereby reducing the driving power consumption of the dimming glass.

Figure 9:
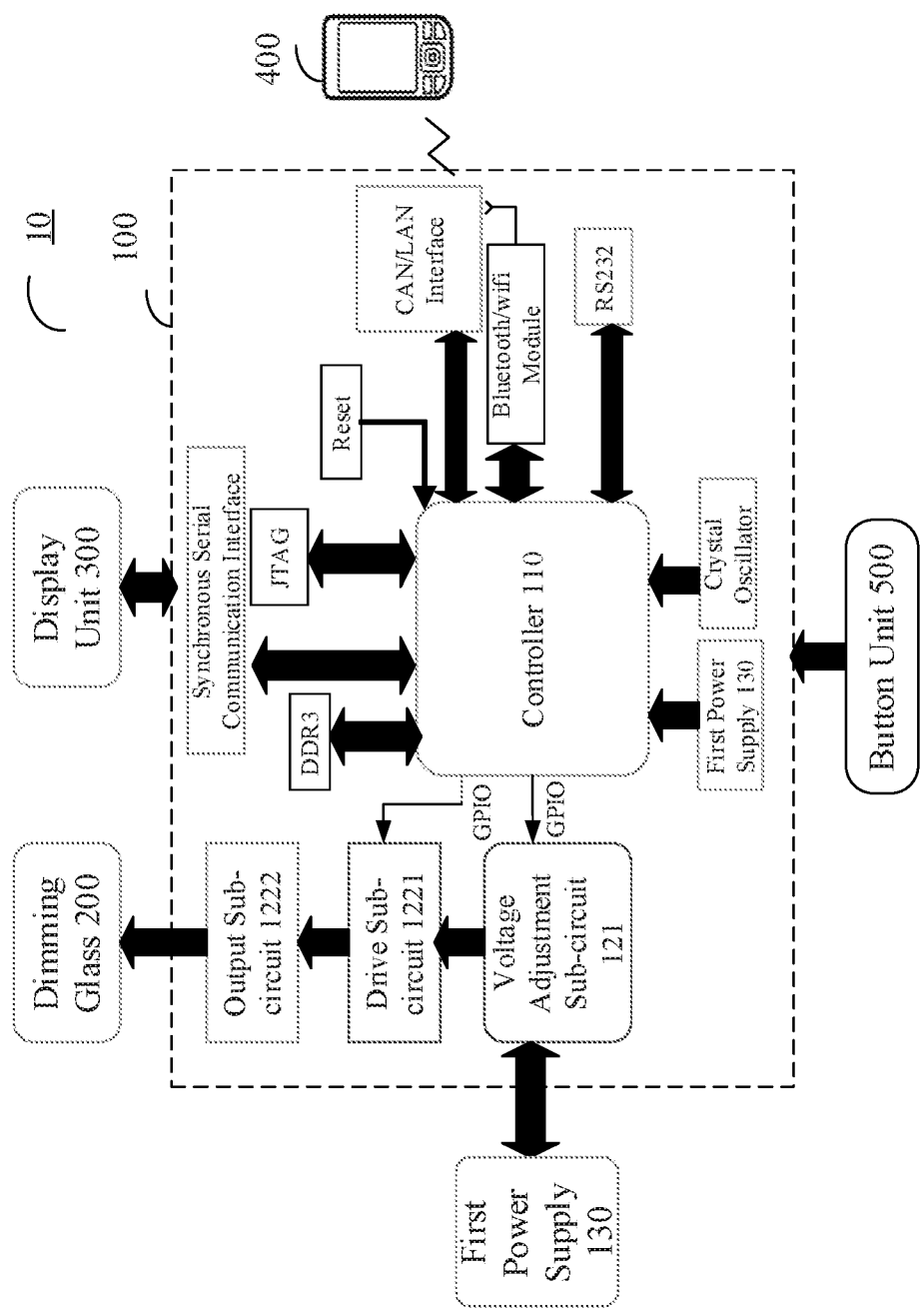
FIG. 9 is a schematic diagram of another dimming glass device provided by some embodiments of the present disclosure.

FIG. 9 is a schematic diagram of another dimming glass device provided by some embodiments of the present disclosure. As shown in FIG. 9, the drive sub-circuit in the dimming glass device 10 also includes some other units, for example, JTAG interface, DDR3, synchronous serial interface (SPI Flash), a reset terminal, a crystal oscillator, a communication module, and the like.

As shown in FIG. 9, in some examples, the dimming glass device 10 may further include a display unit 300. For example, the display unit 300 is configured to display control information and send a control instruction to the controller 110 according to the operation on the control information. For example, the control information may include a display selection button for adjusting the brightness of the dimming glass to be brighter or darker. The user may send the control instruction to the controller 110 by touching the corresponding button, thereby achieving to control the brightness of the dimming glass.

As shown in FIG. 9, for example, in other examples, the dimming glass device 10 may further include a control unit 400. For example, the control unit 400 is configured to send the control instruction to the controller 110. For example, the control unit can be an application on a client or a remote control, etc., so that the brightness of the dimming glass can be controlled by a mobile phone or other devices, thereby improving the portability of life.

As shown in FIG. 9, for example, in other examples, the dimming glass device 10 may further include a button unit 500. For example, the button unit 500 is configured to send the control instruction to the controller 110. For example, the button unit 500 may include buttons provided on the dimming glass device 10, and the user may send corresponding control instructions to the controller 110 through the buttons.

For example, the display unit 300, the control unit 400, or the button unit 500 may communicate with the controller 110 through a wired method, such as CAN bus or RST232, or may send the control instruction to the controller 110 through wireless communication methods, such as Bluetooth and Wifi. The embodiments of the present disclosure are not limited to this case, the communication methods in the following embodiments are the same those described herein, and similar portions are not described in detail again.

For example, for other circuit structures in the embodiments of the present disclosure, reference may be made to the detailed introduction in the above embodiments of the present disclosure, and details are not described herein again.

It should be noted that, for the sake of clarity and conciseness, the entire structure of the dimming glass device 10 is not given. In order to achieve the necessary functions of the dimming glass device 10, those skilled in the art may set other structures not shown according to specific application scenarios, and the embodiments of the present disclosure are not limited thereto.

Figure 10:
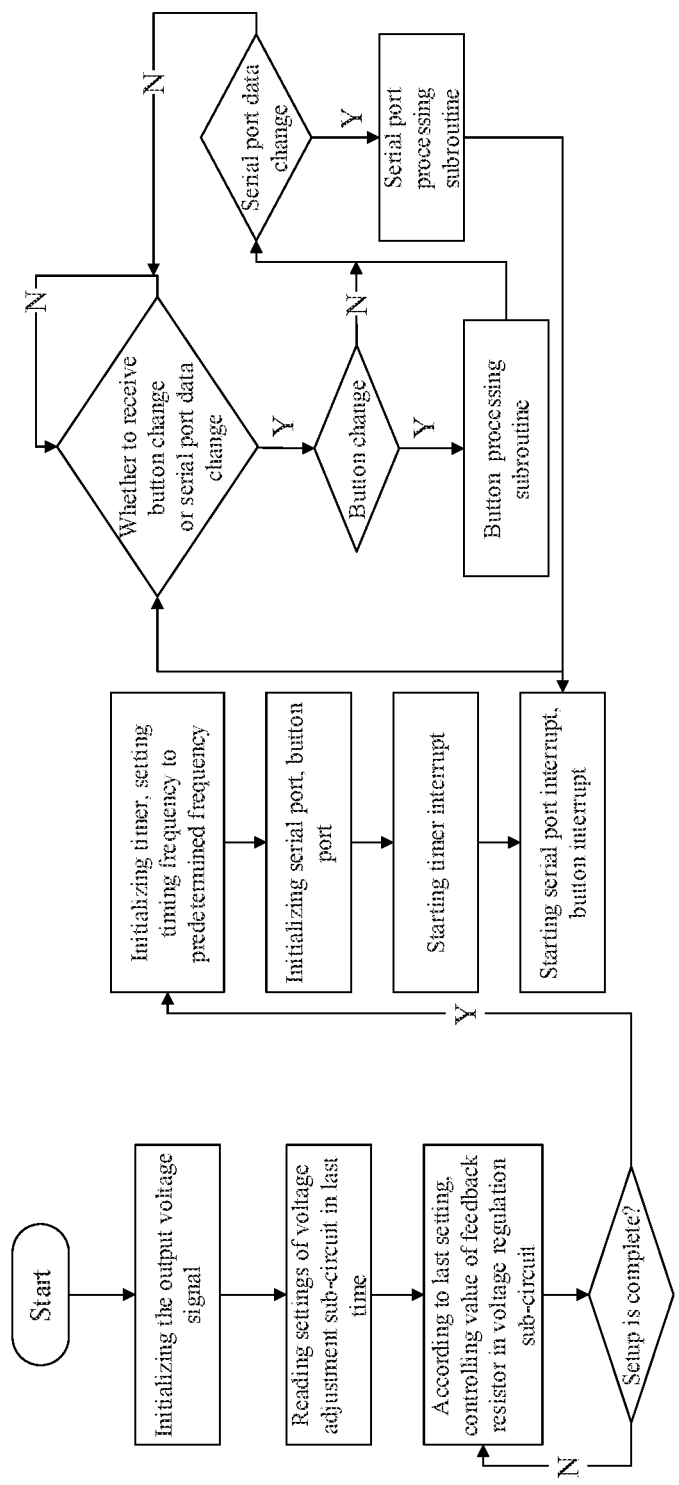
FIG. 10 is a flowchart of main program control of a controller provided by some embodiments of the present disclosure.

FIG. 10 is a flowchart of a main program control of a controller 100 provided by some embodiments of the present disclosure. For example, as shown in FIG. 10, in the main program, first, the output voltage signal of the drive circuit 100 is initialized, and the settings of the voltage adjustment sub-circuit 121 in the last operation are read (for example, setting the last adjustment value of the digitally controlled potentiometer), the second voltage signal is output based on the last adjustment value, and the resistance value of the feedback resistor included in the voltage adjustment sub-circuit is adjusted based on the setting of the voltage adjustment sub-circuit in the last operation. After setting the voltage adjustment sub-circuit 121, the timer in the controller 110 is initialized, and a timer frequency of the timer is set to the refresh frequency, and after initializing the respective serial ports (such as the JTAC interface as shown in FIG. 9 and the like) and the button ports connected to the controller 110, the timer interrupt is started, and the serial port interrupt and the button interrupt are started. For example, the button interrupt can be used to receive the action of the button operation and the light transmittance of the dimming glass is controlled to be adjusted accordingly; the serial port interrupt can be used to receive the control instruction sent by the mobile phone APP, and the relevant commands can be analyzed and processed in the corresponding subroutines respectively, thereby achieving the function of controlling and adjusting the light transmittance of the dimming glass through the mobile phone APP. Therefore, in subsequent steps, if a button change is received, a button processing subroutine is executed; if a serial port data change is received, a serial port processing subroutine is executed.

For example, the H-bridge drive control at the refresh frequency (such as 60 Hz) can be achieved by setting a timer interrupt, the last setting output can be maintained by setting the last adjustment value of the digitally controlled potentiometer, the button operation can be received by the button interrupt, and the light transmittance of the dimming glass can be controlled to adjusted accordingly, the operation control commands sent by the mobile phone APP can be received by the serial port interruption, and the relevant commands are analyzed and processed in the corresponding subroutines respectively, so as to achieve the function of controlling and adjusting the light transmittance of the dimming glass through the mobile phone APP, and the embodiments of the present disclosure are not limited thereto.

Figure 11:
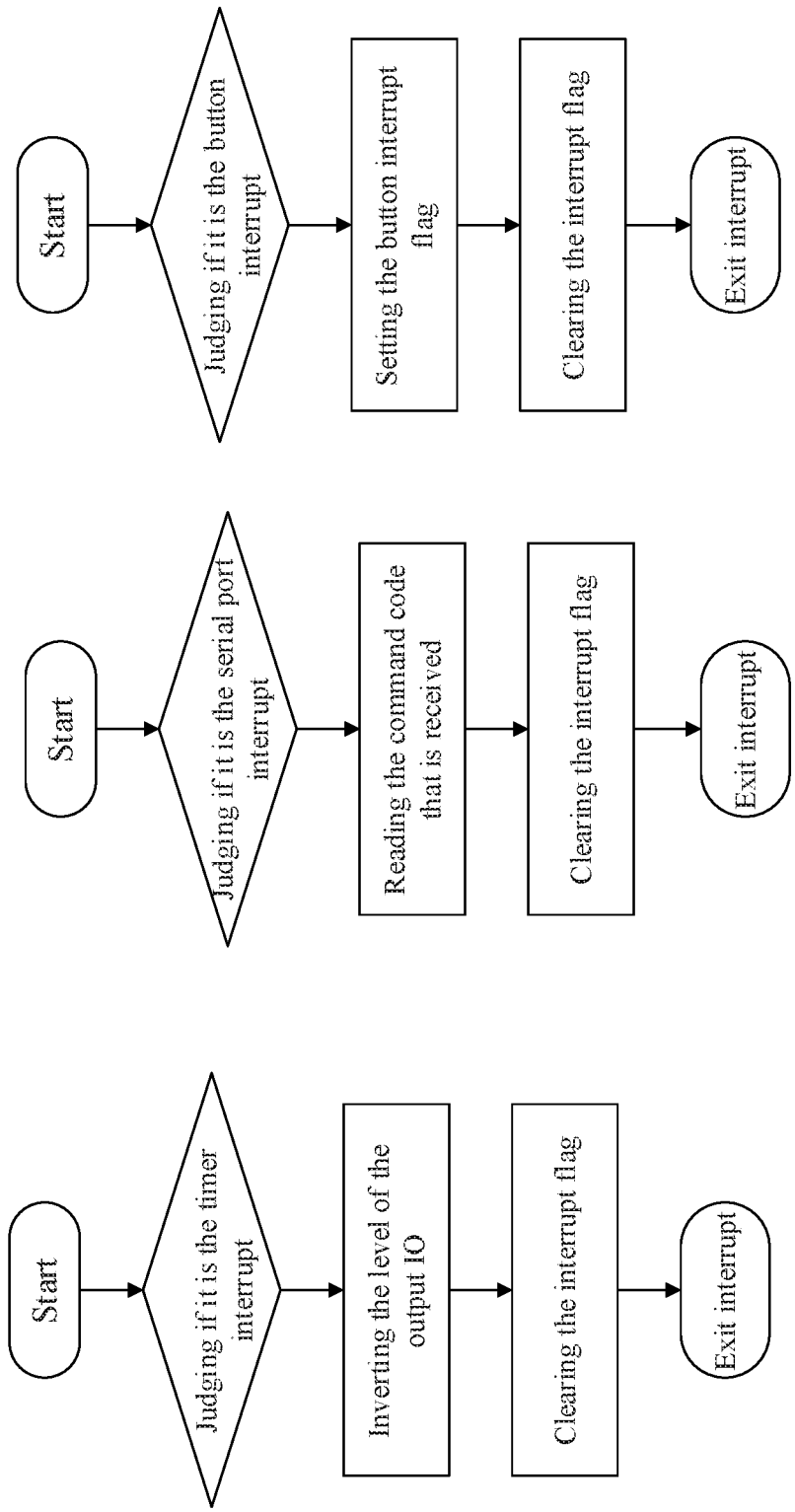
FIG. 11 is a flowchart of interrupting subroutines as shown in FIG. 10.

FIG. 11 is a flowchart of interrupt subroutines shown in FIG. 10. For example, as shown in FIG. 11, the interrupt subroutines used by the dimming glass device include: timer interrupt, serial port interrupt, and button interrupt.

For example, in the case where the timer interrupt is detected, the level of the output IO port is inverted to produce an AC voltage signal, and an interrupt flag is cleared; in the case where the serial port interruption is detected, the control instruction that is received is read and a corresponding output voltage signal is generated according to the control instruction, thereby adjusting the brightness of the dimming glass through the mobile phone APP; and in the case where the button interruption is detected, the button interrupt flag is set and the interrupt flag is cleared, thereby controlling the brightness of the dimming glass according to the button unit.

Figure 12:
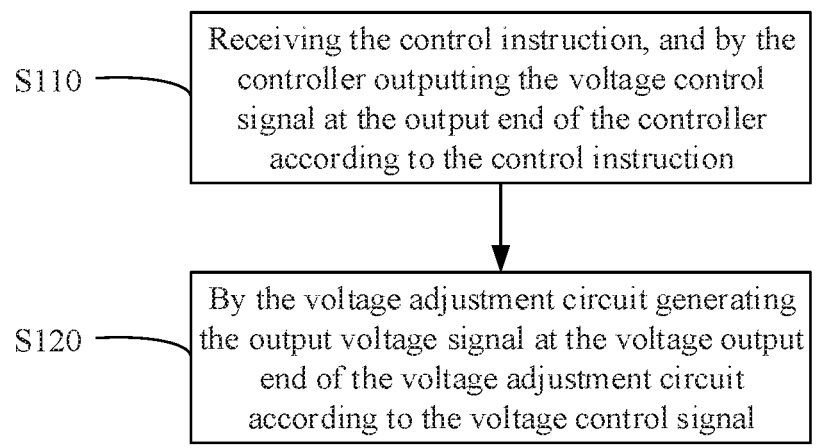
FIG. 12 is a flowchart of a drive method for driving a drive circuit provided by some embodiments of the present disclosure.

Some embodiments of the present disclosure also provide a drive method for driving the drive circuit 100, and the drive method can be used to drive the drive circuit 100 provided by any embodiment of the present disclosure. For example, as shown in FIG. 12, in some examples, the drive method includes:

Step S110: receiving the control instruction, and by the controller, outputting the voltage control signal at the output terminal of the controller according to the control instruction.

Step S120: by the voltage adjustment circuit, generating the output voltage signal at the voltage output terminal of the voltage adjustment circuit according to the voltage control signal.

For example, the output voltage signal adjusts the light transmittance of the dimming glass 200 by controlling the degree of deflection of the liquid crystal molecules in the dimming glass 200.

For example, the drive control of the drive method can be implemented by the flowcharts as shown in FIGS. 10 and 11.

For the technical effect and principle of the drive method for driving the drive circuit 100 provided by the embodiments of the present disclosure, reference may be made to the corresponding description about the drive circuit 100 in the foregoing embodiments, and details are not repeated herein.

The following statements should be noted:

(1) The accompanying drawings of the embodiment(s) of the present disclosure involve only the structure(s) in connection with the embodiment(s) of the present disclosure, and other structure(s) can refer to common design(s).

(2) In case of no conflict, the embodiments of the present disclosure and the features in the embodiments can be combined with each other to obtain new embodiments.

What have been described above are only exemplary implementations of the present disclosure and is not intended to limit the protection scope of the present disclosure, and the protection scope of the present disclosure is determined by the appended claims.

What is claimed is:

1. A drive circuit for a dimming glass, comprising:
a controller, wherein an input terminal of the controller receives a control instruction, and the controller is configured to output a voltage control signal at an output terminal of the controller according to the control instruction; and
a voltage adjustment circuit, wherein a control input terminal of the voltage adjustment circuit is connected to the output terminal of the controller, a power input terminal of the voltage adjustment circuit is connected to a first power supply, and a voltage output terminal of the voltage adjustment circuit is connected to a voltage input terminal of the dimming glass, and the voltage adjustment circuit is configured to generate an output voltage signal at the voltage output terminal of the voltage adjustment circuit according to the voltage control signal,
wherein the output voltage signal adjusts light transmittance of the dimming glass by controlling a degree of deflection of liquid crystal molecules in the dimming glass;
wherein the voltage adjustment circuit comprises:
a voltage adjustment sub-circuit, wherein a control input terminal of the voltage adjustment sub-circuit receives the voltage control signal, a power input terminal of the voltage adjustment sub-circuit is connected to the first power supply to receive a first voltage signal, the voltage adjustment sub-circuit is configured to output a second voltage signal at a voltage output terminal of the voltage adjustment sub-circuit according to the voltage control signal, and a voltage of the first voltage signal is different from a voltage of the second voltage signal; and a voltage output sub-circuit, wherein a voltage input terminal of the voltage output sub-circuit receives the second voltage signal, and the voltage output sub-circuit is configured to output the output voltage signal at a voltage output terminal of the voltage output sub-circuit based on the second voltage signal to control the light transmittance of the dimming glass;

wherein the voltage output sub-circuit comprises:

a drive sub-circuit, wherein a voltage input terminal of the drive sub-circuit is connected to the output terminal of the controller to receive a drive control signal, a power input terminal of the drive sub-circuit is connected to a second power supply, and the drive sub-circuit is configured to amplify the drive control signal and output an amplified drive control signal at a voltage output terminal of the drive sub-circuit;

wherein the second power supply is not connected to the controller.

2. The drive circuit according to claim 1, wherein the first voltage signal and the second voltage signal are DC voltage signals.

3. The drive circuit according to claim 1, wherein the voltage output sub-circuit further comprises:

an output sub-circuit, wherein a drive control terminal of the output sub-circuit is connected to the voltage output terminal of the drive sub-circuit to receive the amplified drive control signal, and a voltage input terminal of the output sub-circuit is connected to the voltage output terminal of the voltage adjustment sub-circuit to receive the second voltage signal, and the output sub-circuit is configured to, under control of the amplified drive control signal, output the output voltage signal at a voltage output terminal of the output sub-circuit according to the second voltage signal.

4. The drive circuit according to claim 3, wherein the controller outputs the drive control signal to the voltage input terminal of the drive sub-circuit according to a refresh frequency.

5. The drive circuit according to claim 3, wherein the output voltage signal output by the output sub-circuit is an AC voltage signal, an amplitude of the AC voltage signal is identical with an amplitude of the second voltage signal, and an alternate frequency of the AC voltage signal is identical with a refresh frequency of the controller.

6. A drive circuit for a dimming glass, comprising:

a controller, wherein an input terminal of the controller receives a control instruction, and the controller is configured to output a voltage control signal at an output terminal of the controller according to the control instruction; and a voltage adjustment circuit, wherein a control input terminal of the voltage adjustment circuit is connected to the output terminal of the controller, a power input terminal of the voltage adjustment circuit is connected to a first power supply, and a voltage output terminal of the voltage adjustment circuit is connected to a voltage input terminal of the dimming glass, and the voltage adjustment circuit is configured to generate an output voltage signal at the voltage output terminal of the voltage adjustment circuit according to the voltage control signal, wherein the output voltage signal adjusts light transmittance of the dimming glass by controlling a degree of deflection of liquid crystal molecules in the dimming glass;

wherein the voltage adjustment circuit comprises:

a voltage adjustment sub-circuit, wherein a control input terminal of the voltage adjustment sub-circuit receives the voltage control signal, a power input terminal of the voltage adjustment sub-circuit is connected to the first power supply to receive a first voltage signal, the voltage adjustment sub-circuit is configured to output a second voltage signal at a voltage output terminal of the voltage adjustment sub-circuit according to the voltage control signal, and a voltage of the first voltage signal is different from a voltage of the second voltage signal; and a voltage output sub-circuit, wherein a voltage input terminal of the voltage output sub-circuit receives the second voltage signal, and the voltage output sub-circuit is configured to output the output voltage signal at a voltage output terminal of the voltage output sub-circuit based on the second voltage signal to control the light transmittance of the dimming glass;

wherein the voltage output sub-circuit comprises:

a drive sub-circuit, wherein a voltage input terminal of the drive sub-circuit is connected to the output terminal of the controller to receive a drive control signal, a power input terminal of the drive sub-circuit is connected to a second power supply, and the drive sub-circuit is configured to amplify the drive control signal and output an amplified drive control signal at a voltage output terminal of the drive sub-circuit;

an output sub-circuit, wherein a drive control terminal of the output sub-circuit is connected to the voltage output terminal of the drive sub-circuit to receive the amplified drive control signal, and a voltage input terminal of the output sub-circuit is connected to the voltage output terminal of the voltage adjustment sub-circuit to receive the second voltage signal, and the output sub-circuit is configured to, under control of the amplified drive control signal, output the output voltage signal at a voltage output terminal of the output sub-circuit according to the second voltage signal;

wherein the voltage output terminal of the drive sub-circuit comprises a first output terminal, a second output terminal, a third output terminal, and a fourth output terminal, the voltage output terminal of the output sub-circuit comprises a first voltage output terminal and a second voltage output terminal, and the output sub-circuit comprises:

a first transistor, wherein a gate electrode of the first transistor is connected to the first output terminal of the drive sub-circuit to receive the amplified drive control signal, a first electrode of the first transistor is connected to the voltage output terminal of the voltage adjustment sub-circuit to receive the second voltage signal, and a second electrode of the first transistor is connected to the first voltage output terminal of the output sub-circuit;

a second transistor, wherein a gate electrode of the second transistor is connected to the second output terminal of the drive sub-circuit to receive the amplified drive control signal, a first electrode of the second transistor is connected to the voltage output terminal of the voltage adjustment sub-circuit to receive the second voltage signal, and a second electrode of the second transistor is connected to the second voltage output terminal of the output sub-circuit;

a third transistor, wherein a gate electrode of the third transistor is connected to the third output terminal of the drive sub-circuit to receive the amplified drive control signal, a first electrode of the third transistor is connected to a first voltage terminal to receive a third voltage signal, and a second electrode of the third transistor is connected to the first voltage output terminal of the output sub-circuit; and a fourth transistor, wherein a gate electrode of the fourth transistor is connected to the fourth output terminal of the drive sub-circuit to receive the amplified drive control signal, a first electrode of the fourth transistor is connected to the first voltage terminal to receive the third voltage signal, and a second electrode of the fourth transistor is connected to the second voltage output terminal of the output sub-circuit.

7. The drive circuit according to claim 6, wherein the output sub-circuit further comprises a bootstrap circuit, a voltage input terminal of the bootstrap circuit is connected to the voltage output terminal of the output sub-circuit to receive the output voltage signal, and the bootstrap circuit is configured to control a voltage at the voltage input terminal of the output sub-circuit according to the output voltage signal.

8. The drive circuit according to claim 7, wherein the bootstrap circuit comprises:

a first capacitor, wherein a first terminal of the first capacitor is connected to the second electrode of the first transistor, and a second terminal of the first capacitor is connected to the gate electrode of the first transistor;

a first diode, wherein a first electrode of the first diode is connected to the second power supply, and a second electrode of the first diode is connected to the gate electrode of the first transistor;

a second capacitor, wherein a first terminal of the second capacitor is connected to the second electrode of the second transistor, and a second terminal of the second capacitor is connected to the gate electrode of the second transistor; and a second diode, wherein a first electrode of the second diode is connected to the second power supply, and a second electrode of the second diode is connected to the gate electrode of the second transistor.

9. The drive circuit according to claim 6, wherein the voltage adjustment sub-circuit comprises:

a digitally controlled potentiometer, wherein a first terminal of the digitally controlled potentiometer serves as the control input terminal of the voltage adjustment sub-circuit and is connected to the output terminal of the controller to receive the voltage control signal, a second terminal of the digitally controlled potentiometer serves as the power input terminal of the voltage adjustment sub-circuit and is connected to the first power supply to receive the first voltage signal, and a third terminal of the digitally controlled potentiometer serves as the voltage output terminal of the voltage adjustment sub-circuit to output the second voltage signal;

a resistor, wherein a first terminal of the resistor is connected to the third terminal of the digitally controlled potentiometer; and an analog-to-digital converter, wherein a first terminal of the analog-to-digital converter is connected to a second terminal of the resistor, and a second terminal of the analog-to-digital converter is connected to the digitally controlled potentiometer.

10. The drive circuit according to claim 6, further comprising a filter circuit, wherein the filter circuit is connected to the voltage output terminal of the output sub-circuit, and is configured to filter a DC voltage in the output voltage signal output by the output sub-circuit.

11. A dimming glass device, comprising:

the drive circuit according to claim 1; and the dimming glass, wherein the dimming glass comprises the liquid crystal molecules, is connected to the voltage output terminal of the drive circuit through a voltage input terminal of the dimming glass to receive the output voltage signal, and controls the degree of deflection of the liquid crystal molecules under control of the output voltage signal.

12. The dimming glass device according to claim 11, wherein the dimming glass further comprises:

a first transparent substrate; and a second transparent substrate opposite to the first transparent substrate, wherein the liquid crystal molecules are between the first transparent substrate and the second transparent substrate and are deflected under control of the output voltage signal output by the drive circuit.

13. The dimming glass device according to claim 11, wherein the liquid crystal molecules are dye liquid crystal molecules.

14. The dimming glass device according to claim 11, further comprising a display unit, wherein the display unit is configured to display control information and send the control instruction to the controller according to an operation on the control information.

15. The dimming glass device according to claim 11, further comprising a control unit, wherein the control unit is configured to send the control instruction to the controller.

16. The dimming glass device according to claim 11, further comprising a button unit, wherein the button unit is configured to send the control instruction to the controller.

17. A drive method for driving the drive circuit for a dimming glass according to claim 1, comprising:

receiving the control instruction, and by the controller, outputting the voltage control signal at the output terminal of the controller according to the control instruction;

by the voltage adjustment circuit, generating the output voltage signal at the voltage output terminal of the voltage adjustment circuit according to the voltage control signal, wherein the output voltage signal adjusts the light transmittance of the dimming glass by controlling the degree of deflection of the liquid crystal molecules in the dimming glass.

18. The drive circuit according to claim 2, wherein the voltage output sub-circuit comprises:

a drive sub-circuit, wherein a voltage input terminal of the drive sub-circuit is connected to the output terminal of the controller to receive a drive control signal, a power input terminal of the drive sub-circuit is connected to a second power supply, and the drive sub-circuit is configured to amplify the drive control signal and output an amplified drive control signal at a voltage output terminal of the drive sub-circuit; and an output sub-circuit, wherein a drive control terminal of the output sub-circuit is connected to the voltage output terminal of the drive sub-circuit to receive the amplified drive control signal, and a voltage input terminal of the output sub-circuit is connected to the voltage output terminal of the voltage adjustment sub-circuit to receive the second voltage signal, and the output sub-circuit is configured to, under control of the amplified drive control signal, output the output voltage signal at a voltage output terminal of the output sub-circuit according to the second voltage signal.

19. The drive circuit according to claim 4, wherein the output voltage signal output by the output sub-circuit is an AC voltage signal, an amplitude of the AC voltage signal is identical with an amplitude of the second voltage signal, and an alternate frequency of the AC voltage signal is identical with a refresh frequency of the controller.

\* \* \* \* \*